US008224596B2

(12) United States Patent
Agrawal et al.

(10) Patent No.: US 8,224,596 B2
(45) Date of Patent: Jul. 17, 2012

(54) PORTABLE DEVICE BATTERY OPTIMIZATION ROUTING SYSTEM

(75) Inventors: Kavita K. Agrawal, Austin, TX (US);
William K. Bodin, Austin, TX (US);
Muna S. Hussaini, Austin, TX (US);
Gregory W. Rybczynski, Pflugerville, TX (US)

(73) Assignee: International Business Machines Corporation, Armonk, NY (US)

( * ) Notice: Subject to any disclaimer, the term of this patent is extended or adjusted under 35 U.S.C. 154(b) by 888 days.

(21) Appl. No.: 12/206,849

(22) Filed: Sep. 9, 2008

(65) Prior Publication Data

US 2010/0063756 A1    Mar. 11, 2010

(51) Int. Cl.
*G01R 31/36* (2006.01)
(52) U.S. Cl. .......... 702/63; 320/128; 320/137; 713/320
(58) Field of Classification Search .......... 702/63; 713/320–324; 320/128, 137
See application file for complete search history.

(56) References Cited

U.S. PATENT DOCUMENTS

| 5,754,029 | A | 5/1998 | Mann et al. |
| 6,189,106 | B1 * | 2/2001 | Anderson .................. 713/300 |
| 6,892,147 | B2 | 5/2005 | Bui et al. |
| 7,231,198 | B2 | 6/2007 | Loughran |
| 7,288,918 | B2 | 10/2007 | DiStefano |
| 2005/0194926 | A1 | 9/2005 | Di Stefano |
| 2008/0059256 | A1 | 3/2008 | Lynch |
| 2009/0058361 | A1 * | 3/2009 | John .......................... 320/128 |
| 2009/0187780 | A1 * | 7/2009 | Keohane et al. ............. 713/324 |

OTHER PUBLICATIONS

"Battery Charging Going Wireless", *Wireless Watch Japan*, http://wirelesswatch.jp/2007/06/04/battery-charging-going-wireless/ (obtained Jul. 22, 2008),(Jun. 4, 2007).
Nozawa, Tetsuo "Battery Charging Goes Wireless", *Tech-On!*, Nikkei Electronics Asia. http://techon.nikkeibp.co.jp/article/HONSHI/20070530/133362/ (obtained Jul. 22, 2008),(Jun. 2007).
Harrist, Daniel W., "Wireless Battery Charging System Using Radio Frequency Energy Harvesting", Master's Thesis or Dissertation, University of Pittsburgh. <http://etd.library.pitt.edu/ETD/available/etd-07212004-192328/unrestricted/Harrist_Thesis_072804.pdf>,(Jul. 28, 2004).

* cited by examiner

*Primary Examiner* — Drew A Dunn
*Assistant Examiner* — Hien Vo
(74) *Attorney, Agent, or Firm* — DeLizio Gilliam, PLLC

(57) ABSTRACT

A battery life management unit for managing the battery life of a portable device. The battery life management unit determines a scheduled event for a user of a portable device and estimates whether battery power of the portable device will last throughout the scheduled event. If the battery power of the portable device is estimated not to last throughout the scheduled event, the battery life management unit determines whether a location of the scheduled event provides one or more battery charging resources. If the location of the scheduled event provides one or more battery charging resources, the battery life management unit reserves a battery charging resource for the user of the portable device.

20 Claims, 5 Drawing Sheets

US 8,224,596 B2

PORTABLE DEVICE BATTERY OPTIMIZATION ROUTING SYSTEM

BACKGROUND

Embodiments of the inventive subject matter generally relate to the field of power management systems, and, more particularly, to a portable device battery optimization system.

Portable electronics have become a necessity for consumers both for personal and business use. One of the main limitations of portable devices is battery life. Manufacturers of portable devices are continually challenged to maintain battery life at acceptable levels as the physical dimensions of portable devices shrink and the processing requirements increase. When operating a portable device, even a portable device with superior battery life, the user has to remain conscious of the power status of the battery. When the portable device is operated on battery power for an extended amount of time, the user has to remember to bring a backup battery source, if available. For example, in a business context, an employee may have to bring a backup battery pack for a laptop if a meeting or conference is projected to last longer than the battery life of the laptop. Furthermore, after operating the portable device on battery power for an extended amount of time, the user has to remember to charge the battery before once again operating the portable device on battery power, or risk the portable device running out of power.

SUMMARY

Various embodiments are disclosed of a method for managing the battery life of a portable device. In one embodiment, a battery life management unit determines a scheduled event for a user of a portable device and estimates whether battery power of the portable device will last throughout the scheduled event. If the battery power of the portable device is estimated not to last throughout the scheduled event, the battery life management unit determines whether a location of the scheduled event provides one or more battery charging resources. If the location of the scheduled event provides one or more battery charging resources, the battery life management unit reserves a battery charging resource for the user of the portable device.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

The description that follows includes exemplary systems, methods, techniques, instruction sequences and computer program products that embody techniques of the present inventive subject matter. However, it is understood that the described embodiments may be practiced without these specific details. For instance, although examples refer to a battery life management unit implemented within a portable device (e.g., a laptop), it is noted that in other embodiments the battery life management unit may be implemented within a network server, or in a distributed manner across various network devices. In other instances, well-known instruction instances, protocols, structures and techniques have not been shown in detail in order not to obfuscate the description.

Various embodiments are disclosed of a system and method for managing the battery life of a portable device. In one embodiment, a battery life management unit monitors the schedule or itinerary of a user of the portable device and manages the battery life of the portable device such that the user has enough battery power to operate the portable device during one or more scheduled events. The battery life management unit automatically estimates whether the battery power will last throughout a scheduled event based on various criteria (e.g., duration of the scheduled event, device attributes, role of the user during the scheduled event, etc.). The battery life management unit reserves a battery charging resource (e.g., power outlet, wireless charging, etc.) at the event location for the user of the portable device and/or recommends the user to take certain steps to help prevent the user from running out of power during the scheduled event.

Figure 1:
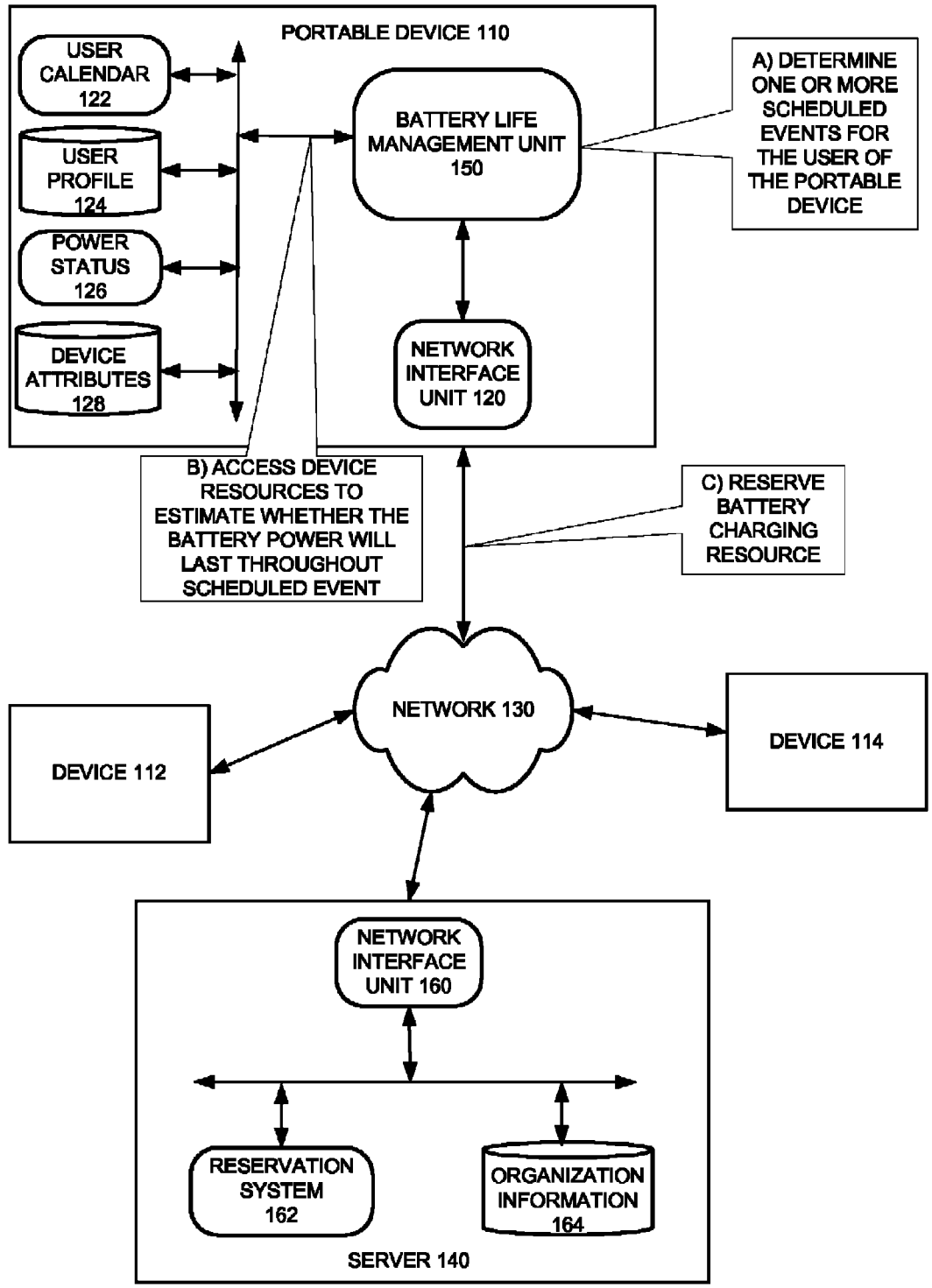
FIG. 1 depicts a conceptual diagram of one embodiment of a portable device comprising a battery life management unit.

FIG. 1 depicts a conceptual diagram of one embodiment of a portable device 110 comprising a battery life management unit 150. The portable device 110 further includes a network interface unit 120, a user calendar 122, a user profile database 124, a power status unit 126, and a device attributes database 128. The portable device 110 may be any of various types of portable devices, e.g., a laptop, mobile phone, personal digital assistant (PDA), etc. The portable device 110 can connect to a server 140 via the network interface unit 120 and network 130, e.g., a local area network (LAN) or a Wireless LAN (WLAN). In one example, the portable device 110 can connect to server 140 via the intranet of an organization or via the Internet. The portable device 110 can also connect to various other network devices, such as devices 112 and 114, which may also include battery life management systems. In one example, the server 140 may include a network interface unit 160, an organization reservation system 162, and an organization information database 164. The server 140 may be managed by an organization or other entity (e.g., a business or university) and may offer services to members, employees, clients, and/or guests of the organization. It is noted that in some implementations the portable device 110 may connect to the reservation systems (and other resources) of multiple network servers associated with various organizations/entities, e.g., a server of the user's employer and a server of the local airport.

In various implementations, the battery life management unit 150 is software (e.g., an application programming interface (API), a downloadable plug-in, etc.) that obtains and analyzes information from various device resources, such as the user calendar 122, the user profile database 124, the power status unit 126, and the device attributes database 128, and various network resources, such as the organization reservation system 162 and the organization information database 164, to improve management of the battery life associated with the portable device 110. In one example, the user calendar 122 is a software application used to store a user's schedule, and therefore may provide information such as the duration and location of a scheduled event and the role of the user with respect to a scheduled event. The user profile database 124 is user profile data stored in memory (or on a hard disk) that provides a variety of information about the user of the portable device 110, such as the occupation and title within an organization, the number of years of service, a photo of the user, the user's resume, etc. The power status unit 126 is a software mechanism that monitors the power status, power scheme, and other power settings of the battery of the portable device 110. The device attribute database 128 is device attribute data stored in memory (or on a hard disk) that provides a variety of information about the portable device 110, such as manufacturer and model information, processing speed, power consumption, etc. The organization reservation system 162 is a system implemented by an organization or other entity that allows organization members, employees, and/or guests to reserve seats and battery charging resources at various locations within the one or more facilities of the organization e.g., conference rooms or auditoriums used for organization events. The organization information database 164 is organization-related data stored in memory (or on a hard disk) that provides a variety of information about the organization, such as organizational chart, facility information (e.g., conference room resources), organization member profiles and resumes, etc.

It is noted, however, that in other implementations the battery life management unit 150 may comprises both hardware and software elements. It is also noted that the device and network resources described above may also provide additional information and functions, e.g., the reservation system 162 may provide an organizational calendar of events and a feature to schedule and organize events. Furthermore, it is noted that the term "database" has been employed for ease of illustration, and narrow construction of the term should not be used to limit embodiments. The data stored in these example databases can be stored in accordance with any of a variety of data structures and types of data stores (e.g., a hardware table, directory, etc.).

In one implementation, at stage A, the battery life management unit 150 utilizes the user calendar 122 to identify one or more scheduled events for the user of the portable device 110, e.g., events scheduled within the next four hours on a particular day or all events scheduled that day. At stage B, the battery life management unit 150 accesses at least some of the device resources, e.g., the user calendar 122 and the device attributes database 128, and implements one or more analysis algorithms to estimate whether the battery power will last throughout the one or more scheduled events. At stage C, if the battery power is estimated not to last throughout the one or more scheduled events, the battery life management unit 150 uses the reservation system 162 to reserve a battery charging resource (e.g., a power outlet) at the location of the scheduled event (e.g., a conference room) for the user of the portable device 110, as will be further described below with reference to FIG. 2.

It should be noted that the components described with reference to FIG. 1 are meant to be exemplary only, and are not intended to limit the inventive subject matter to any specific set of components or configurations. For example, in various embodiments, one or more of the components described may be omitted, combined, modified, or additional components included, as desired. For instance, in some embodiments, the battery life management unit 150 may be implemented in a network server (e.g., the server 140) via the Internet, and/or in a distributed manner across some or all network components. It is further noted that in some implementations additional device and/or network resources may be accessed by the battery life management unit 150, e.g., a Global Positioning System (GPS) unit for location awareness.

Figure 2:
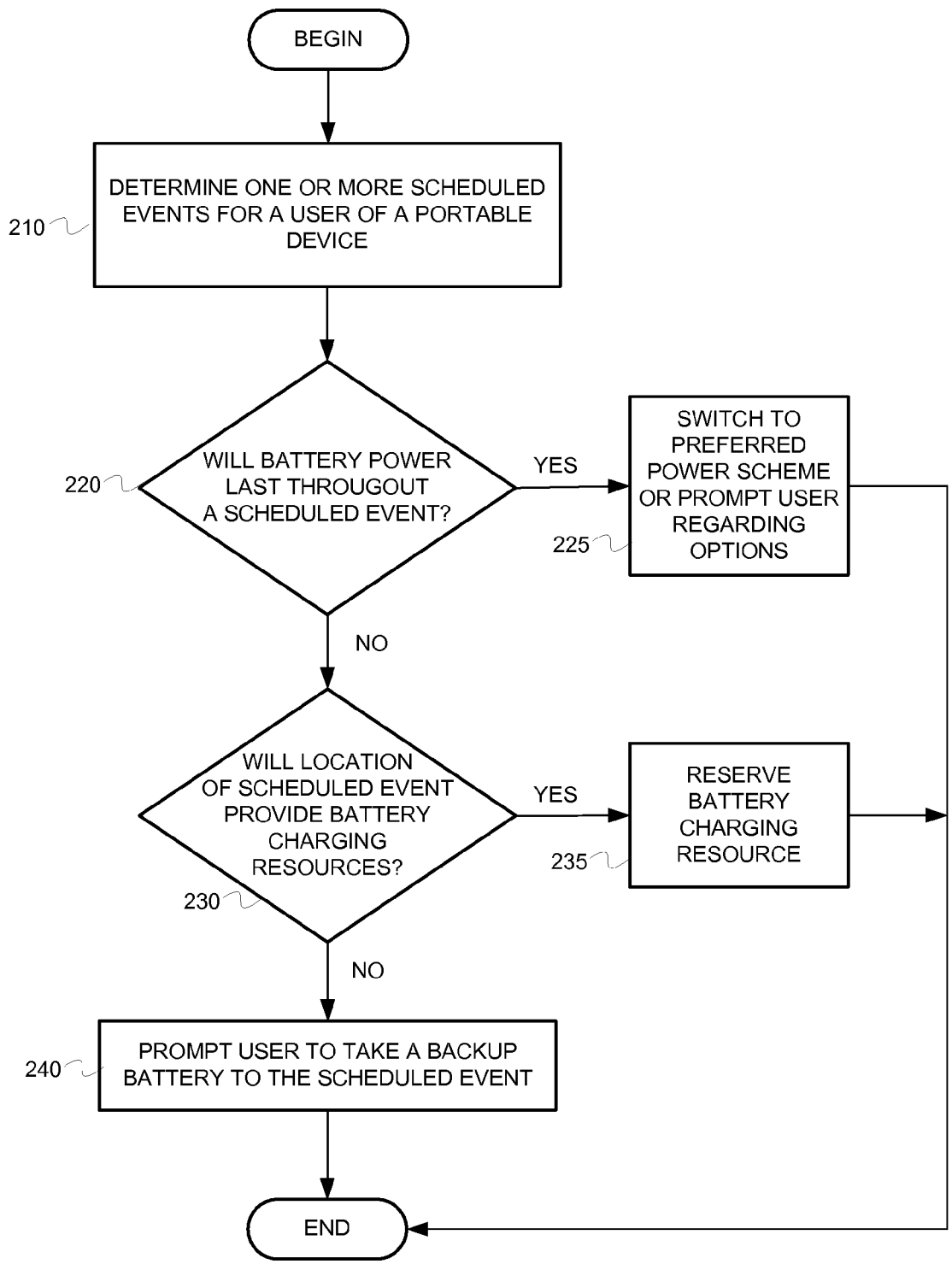
FIG. 2 depicts an example flow diagram of a method for managing the battery life of the portable device.

FIG. 2 is an example flow diagram of a method for managing the battery life of the portable device 110. At block 210, one or more scheduled events are identified for the user of the portable device 110. In one implementation, the battery life management unit 150 reads the user calendar 122 to identify events scheduled within a predetermined number of hours, e.g., within the next four hours on a particular day or all events scheduled that day. In one example, the battery life management unit 150 may determine that the user has a presentation scheduled from 10 am-12 pm, a lunch meeting from 1-2 pm, and a group meeting from 2-3 pm. The process may begin at various times throughout the day, e.g., after power-up of the portable device 110, based on a set schedule specifying predetermined times throughout the day (e.g., hourly), when the power cord is unplugged and the device begins to run on battery power, when manually started by the user, and/or each time a new event is added to the user's schedule. It is noted that the scheduled events may be various types of events, such as on-site meetings, off-site meetings, conferences, business travel, etc.

At block 220, it is determined whether the battery power of the portable device 110 will last throughout a scheduled event. For instance, in the example described above, the battery life management unit 150 determines whether the battery power of the portable device 110 will last throughout the presentation scheduled from 10 am-12 pm. In one implementation, the battery life management unit 150 determines whether the battery power will last throughout the scheduled event based, at least in part, on portable device attributes and metrics, duration of the scheduled event, user role during the scheduled event, projected portable device usage during scheduled event, available power schemes, and current or projected starting battery power, among others. In one example, the battery life management unit 150 may determine that the portable device 110 is a laptop projected to have full battery power when the presentation starts at 10 am. In this example, the battery life management unit may also determine that the user is the presenter and will use several power hungry applications during the two-hour presentation. Based on this information obtained from the device resources, the battery life management unit 150 may determine that the battery power will not last throughout the scheduled presentation.

Furthermore, in some implementation, the battery life management unit 150 may determine whether there is enough time in between scheduled events to charge the battery. For instance, in the example described above, the battery life management unit 150 may determine that an hour in between the presentation meeting and the lunch meeting is enough time to charge the battery. The battery life management unit 150 may also estimate whether the battery will last throughout two or more back-to-back events. In the above example, if the battery is estimated to be fully charged for the lunch meeting at 1 pm, the battery life management unit 150 can estimate whether a fully charged battery will last throughout both the lunch meeting at 1 pm and the group meeting at 2 pm.

At block 225, if the battery power is estimated to last throughout the scheduled event (e.g., the scheduled two-hour presentation or a scheduled two-hour flight), the battery life management unit 150 causes the portable device 110 to automatically switch to a preferred power scheme, e.g., a presentation power scheme, and the process ends. In another example, the battery life management unit 150 may prompt the user to select from a list of suggested power schemes that may result in the battery lasting throughout the scheduled event.

If the battery power is estimated not to last throughout a scheduled event, at block 230, it is determined whether the location of the scheduled event provides one or more battery charging resources. For example, the battery life management unit 150 may access the organization information database 164 to determine whether the location of the scheduled event offers wireless charging and/or power outlets. In this example, the battery life management unit 150 may also determined whether the portable device 110 is compatible with the battery charging resource, e.g., whether a laptop is compatible to utilize the wireless charging resource. At block 235, if the location of the scheduled event does provide one or more battery charging resources, a battery charging resource is reserved for the user of the portable device 110, and the process ends. For example, the battery life management unit 150 may access the reservation system 162 to reserve a power outlet and a seat near the power outlet, or a seat within the wireless charging area of the facility. In one embodiment, the battery charging resources may be reserved on a first-come, first-serve basis. It is noted that in some embodiments the battery life management unit 150 may reserve battery charging resources according to an event participant priority queuing process, e.g., based on the role of the user during the scheduled event, as will be described further below with reference to FIG. 3. It is further noted that in some implementations the battery life management unit 150 may also determine whether the event location has other resources, e.g., backup battery packs.

In some cases, the user of the portable device has two or more back-to-back scheduled events, e.g., a lunch meeting at 1 pm and a group meeting at 2 pm. If the battery life management unit 150 estimates that the battery will not last throughout the two or more back-to-back events, in one example, the battery life management unit 150 determines whether the location of the first scheduled event or the location of the second scheduled event has battery charging resources. In this example, the battery life management unit 150 may reserve a battery charging resources at either the first scheduled event location or the second scheduled event location, e.g., depending on where the battery is estimated to run out of power, or at both of the first and second scheduled event locations, e.g., if the battery will need charging during both events.

At block 240, if the location of the scheduled event does not offer battery charging resources, the user is prompted to take a backup battery to the scheduled event, and the process ends. For example, the battery life management unit 150 may provide a notice via a pop-up window, email, text message, etc. Furthermore, the battery life management 150 may provide the user information of where to obtain a backup battery, e.g., a loaner battery offered by the organization.

Figure 3:
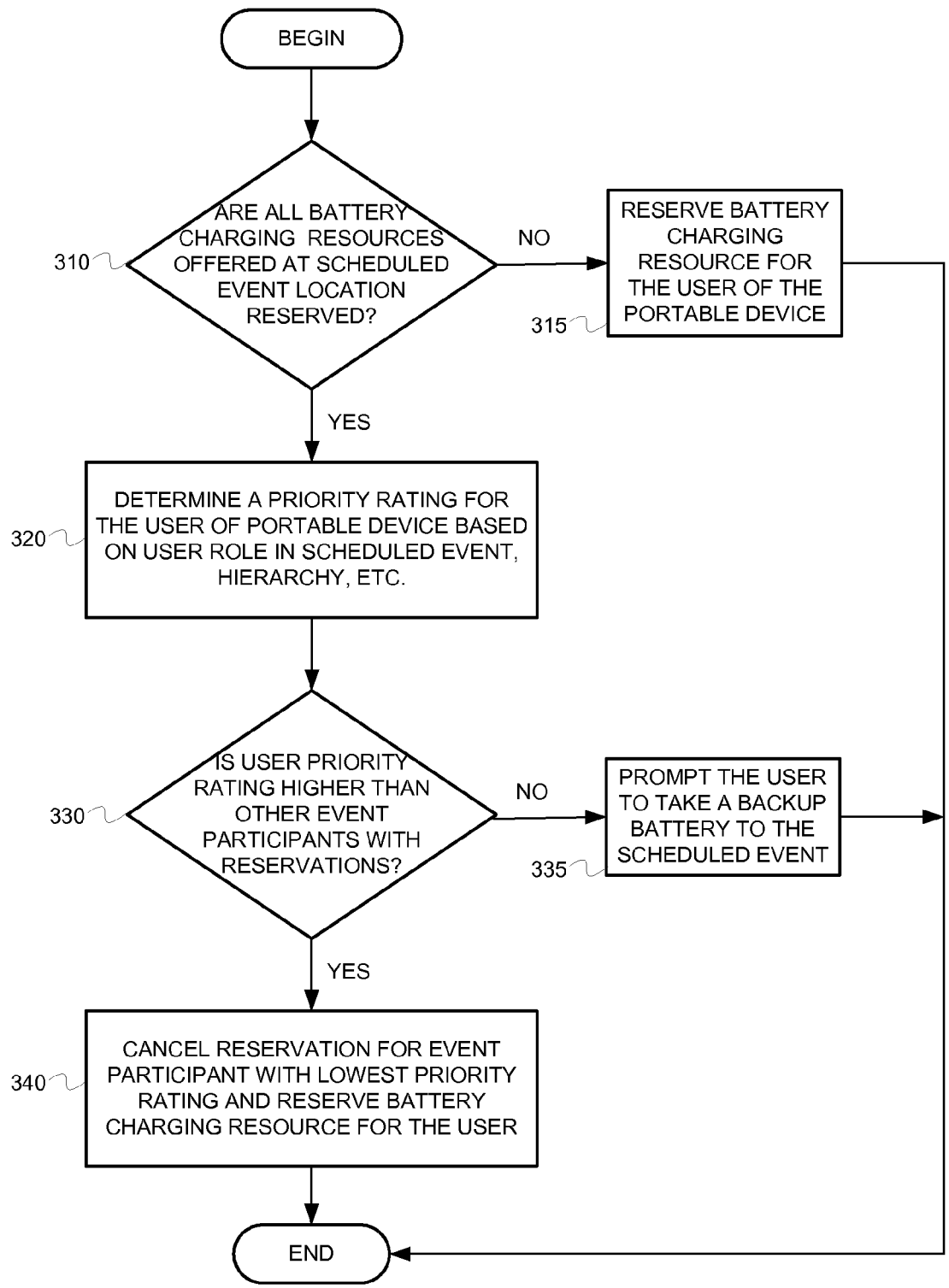
FIG. 3 depicts an example flow diagram of a method for reserving battery charging resources according to an event participant priority queuing process.

FIG. 3 is an example flow diagram of a method for reserving battery charging resources according to an event participant priority queuing process. At block 310, it is determined whether all the battery charging resources offered at the location of the scheduled event are reserved. For example, the battery life management unit 150 determines whether all the power outlets and/or the seats within a wireless charging area are reserved for the scheduled event. If all the battery charging resources are not reserved, at block 315, a battery charging resource is reserved for the user of the portable device 110, as described above with reference to block 235 of FIG. 2.

At block 320, if all the battery charging resources offered at the scheduled event location are reserved, a priority rating is determined for the user of the portable device 110 based on the role of the user in the scheduled event, the user's position within the hierarchy of the organization, the years of service within the organization, and/or the importance of the work to be performed by the user during the scheduled event, among others. For instance, the battery life management unit 150 assigns a priority rating from 1 to 10 based on one of the priority characteristics described above (e.g., the role of the user), or based on multiple priority characteristics (e.g., the role of the user and hierarchy). In one example, the battery life management unit 150 may access the user's calendar to determine the role of the user during the scheduled event. If the scheduled event is a reoccurring event, historical information associated with the user and the event may be accessed to determine the user's typical role during the event. In this example, if the user is determined to be a presenter during the event, the user is assigned a higher priority than most or all of the event participants, e.g., a priority rating of 10. In another example, if the user is a first line manager that will just be an observer during the event, the user will have a lower priority rating (e.g., priority rating of 5) than a third line manager or vice president that is attending the event as an observer (e.g., priority rating of 8).

At block 330, it is determined whether the priority rating assigned to the user of the portable device 110 is higher than the priority rating of other event participants that have reserved a battery charging resource. In one example, the location of the scheduled event may have twelve battery charging resources (e.g., power outlets) reserved, and the event participants with the reservations may have priority ratings ranging from 6 to 10.

At block 335, if the user of the portable device 110 does not have a priority rating that is higher than the event participants with a reservation, the user is prompted to take a backup battery to the scheduled event. In this case, since the battery life management unit 150 has already determined that the battery power will not last throughout the scheduled event, and the user does not have a high enough priority to reserve a battery charging resource, the battery life management unit 150 suggests that the user take a battery backup to make sure the user has enough power to operate the portable device 110 throughout the event.

At block 340, if the user of the portable device 110 has a priority rating that is higher than at least one event participant with a reservation, the reservation for the event participant with the lowest priority rating is cancelled and a battery charging resource is reserved for the user, and then the process ends. For example, if the user is assigned a priority rating of 7, the reservation for an event participant having a priority rating of 6 will be cancelled and the reservation will be provided to the user. In one implementation, a queue is maintained of the event participants with the highest priority ratings. Since the priority ranking of the event participants can change, the reservations provided to the event participants with the highest priority ratings may be temporary until a predetermined time before the scheduled event when they are made permanent. In some implementations, one or more of the seats having battery charging resources may be permanently reserved for certain event participants by assigning them the highest priority ratings regardless of their priority characteristics (or, alternatively, these event participants may be exempt from the priority queuing process), e.g., a customer, a new employee, or an important guest.

In other implementations, the priority queuing process may also provide the best seats having battery charging resources based on the priority ranking. In other words, the best seat having a battery charging resource is reserved for the event participant having the highest priority rating, the second best seat is reserved for the event participant having the second highest priority rating, and so on. Furthermore, as described above, it is noted that the battery life management unit 150 can be implemented within the portable device 110, within the server 140, or in a distributed manner across the various network devices, e.g., across both the portable device 110 and the server 140. For example, the portable device 110 may include part or all of the functionality of the battery life management unit 150, e.g., the functionality described with reference to FIG. 2, and the server 140 may include part or all of the functionality of the battery life management unit 150, e.g., the functionality described with reference to FIG. 3, such as granting, denying, and cancelling reservations based on priority ratings.

Figure 4:
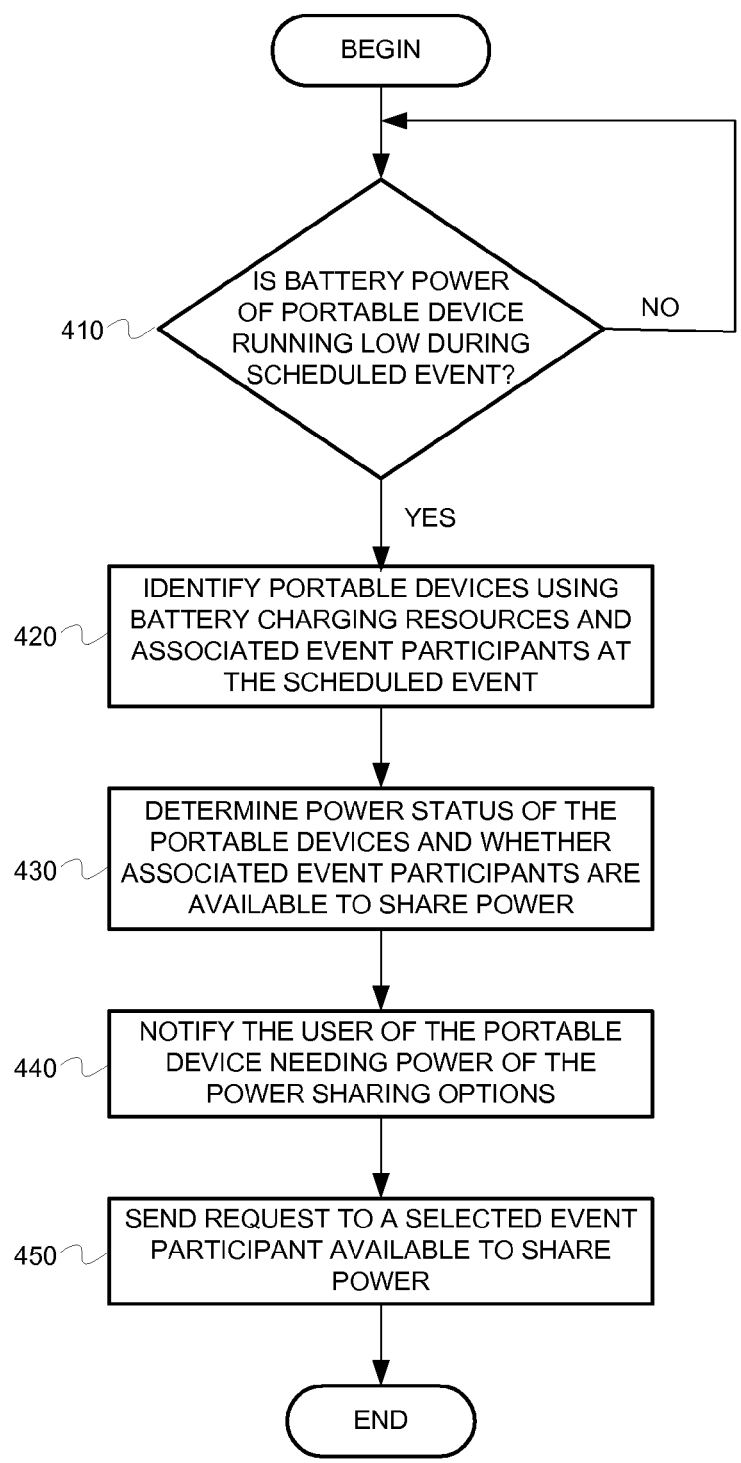
FIG. 4 depicts an example flow diagram of a method for sharing battery charging resources during a scheduled event.

FIG. 4 is an example flow diagram of a method for sharing battery charging resources during a scheduled event. At block 410, it is determined whether the battery power of the portable device 110 is running low during the scheduled event. For example, the battery life management unit 150 may determine whether the battery is at less than 25% of capacity. If the battery power is not running low, the process loops back and restarts after a predetermined period of time. It is noted that in other embodiments, instead of or in addition to detecting whether the battery power is running low, during the scheduled event, the battery life management unit 150 may determine whether the battery power is projected to run out. For example, the battery is currently at 50% of capacity but the user has increased usage of the laptop and now the battery power is expected to run out before the end of the scheduled event.

At block 420, if the battery power is running low (and/or projected to run out), the portable devices connected to battery charging resources and the associated event participants at the scheduled event are identified. In one example, the battery life management unit 150 accesses the reservation system 162 to identify the event participants that have reserved a battery charging resource and the seating arrangement. In another example, the battery life management unit 150 may detect the portable devices connected to the network that are utilizing battery charging resources and may identify the associated event participants by matching the detected portable devices to the owners of the portable devices (e.g., employees of an organization). In one related example, one of the network devices connected to server 140 may be a webcam. The webcam may take pictures of the event participants using battery charging resources and the server 140 may identify the associated event participants by matching the webcam pictures to those stored within a database of member/employee profiles.

At block 430, the power status of the portable devices connected to the battery charging resources and whether the associated event participants are available to share power is determined. For example, the battery life management unit 150 may determine which of the portable devices that are connected to a battery charging resource have batteries that are fully charged, and determine which of the associated event participants are located nearby the user of the portable device needing power. In one implementation, if an event participant that is seated nearby the user needing power is using a portable device that is connected to a battery charging resource and has a battery charge above a predetermined level, the event participant may be considered available to share power. It is noted, however, that in other implementations the event participant may be considered available to share power even if the event participant is not located nearby the user needing power. In these implementations, the user needing power may be provided with the location of the event participant and the user can determine whether to attempt to share power with the event participant.

At block 440, the user of the portable device needing power is notified of the power sharing options. For example, the battery life management unit 150 may display a list of the event participants that are available to share power on the user's screen. The battery life management unit 150 may also display additional information associated with the event participants, e.g., the seat location of the event participants, a picture of the event participants, email address and job titles of the event participants, etc. In one example, the list of event participants that are available to share power is displayed below the power status of the portable device needing power. It noted, however, that in other implementations the list of available event participants may be provided to the user by other means, e.g., via email, instant messaging, or text message.

At block 450, a request to share power is sent to the event participant selected by the user of the portable device needing power. For example, the user of the portable device needing power may select one of the available event participants from the displayed list. After the selection, a window may be displayed that allows the user to type a message to the selected event participant. For example, the user may ask an event participant seating two seats down whether the user can temporarily use the power outlet the event participant is currently using. In another example, the user may ask the event participant whether they can switch seats so the user can access the power outlet (or the wireless charging resource) the event participant is currently using. The event participant can either accept or decline the request received from the user needing power.

It should be understood that the depicted flowcharts are examples meant to aid in understanding embodiments and should not be used to limit embodiments or limit scope of the claims. Embodiments may perform additional operations, fewer operations, operations in a different order, operations in parallel, and some operations differently. For instance, with reference to FIG. 2, in some embodiments, the battery life management unit 150 may determine whether each scheduled event is a social event or a business-related event, and/or may determine whether the user typically takes the portable device 110 during such a scheduled event based on historical information associated with the user. Furthermore, with reference to FIG. 3, in some embodiments, the battery life management unit 150 may also consider the type of portable device the user is going to use during the scheduled event. In these embodiments, the battery life management unit 150 may give higher priorities to event participants that are going to use laptops compared to event participants that are going to have PDAs or mobile phones.

Embodiments may take the form of an entirely hardware embodiment, a software embodiment (including firmware, resident software, micro-code, etc.) or an embodiment combining software and hardware aspects that may all generally be referred to herein as a "circuit," "module" or "system." Furthermore, embodiments of the inventive subject matter may take the form of a computer program product embodied in any tangible medium of expression having computer usable program code embodied in the medium. The described embodiments may be provided as a computer program product, or software, that may include a machine-readable medium having stored thereon instructions, which may be used to program a computer system (or other electronic device(s)) to perform a process according to embodiments, whether presently described or not, since every conceivable variation is not enumerated herein. A machine readable medium includes any mechanism for storing ("machine-readable storage medium") or transmitting "machine-readable signal medium") information in a form (e.g., software, processing application) readable by a machine (e.g., a computer). The machine-readable storage medium may include, but is not limited to, magnetic storage medium (e.g., floppy diskette); optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions. In addition, machine-readable signal medium embodiments may be embodied in an electrical, optical, acoustical or other form of propagated signal (e.g., carrier waves, infrared signals, digital signals, etc.), or wireline, wireless, or other communications medium.

Computer program code for carrying out operations of the embodiments may be written in any combination of one or more programming languages, including an object oriented programming language such as Java, Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN), a personal area network (PAN), or a wide area network (WAN), or the connection may be made to an external computer (for example, through the Internet using an Internet Service Provider).

Figure 5:
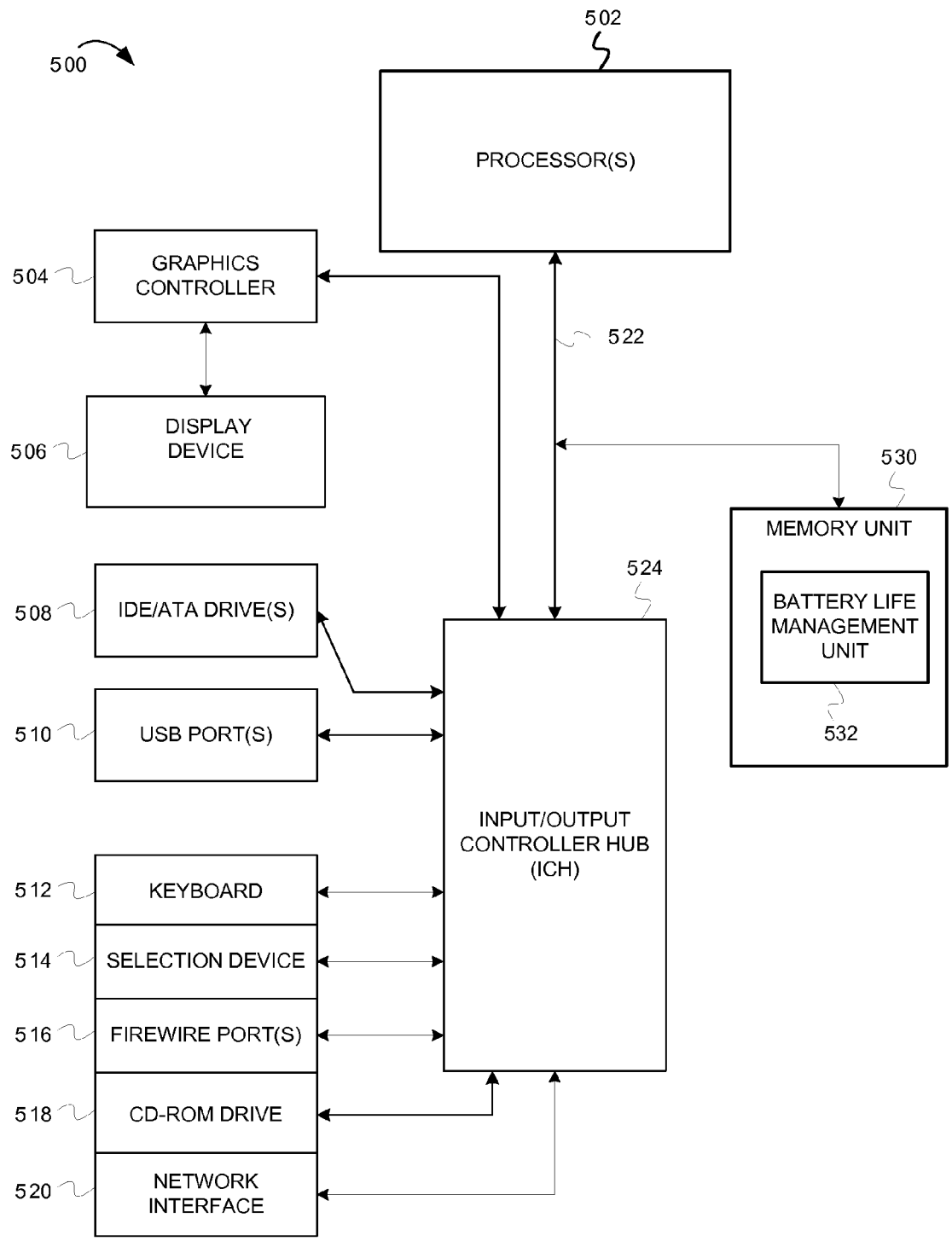
FIG. 5 depicts an example computer system that embodies a battery life management unit.

FIG. 5 depicts an example computer system 500 that embodies a battery life management unit 532. The computer system 500 includes a processor 502. The processor 502 is connected to an input/output controller hub 524 (ICH), also known as a south bridge, via a bus 522 (e.g., PCI, ISA, PCI-Express, HyperTransport, etc). A memory unit 530 interfaces with the processor 502 and the ICH 524. The main memory unit 530 can include any suitable random access memory (RAM), such as static RAM, dynamic RAM, synchronous dynamic RAM, extended data output RAM, etc. The ICH 524 connects and controls peripheral devices. In FIG. 5, the ICH 524 is connected to IDE/ATA drives 508 (used to connect external storage devices) and to universal serial bus (USB) ports 510. The ICH 524 may also be connected to a keyboard 512, a selection device 514, firewire ports 516 (for use with video equipment), CD-ROM drive 518, and a network interface 520. The ICH 524 can also be connected to a graphics controller 504. The graphics controller is connected to a display device 506 (e.g., monitor).

In one embodiment, the memory unit 530 includes a battery life management unit 532. The battery life management unit 532 may be configured to determine whether the battery power of a portable device will last throughout a scheduled event and reserve a battery charging resource at the location of the scheduled event if the battery power will not last throughout the scheduled event (see FIG. 2). The battery life management unit 532 can also reserve the battery charging resources at the location of the scheduled event based on assigned priority ratings associated with the event participants, e.g., priority ratings assigned based on the role of the user during the scheduled event (see FIG. 3). Furthermore, the battery life management unit 532 may allow an event participant that is running out of power to identify and contact other event participants that are available to share power (see FIG. 4).

Although FIG. 5 shows the battery life management unit 532 in memory 530, the battery life management unit 532 need not be embodied in the memory. For example, the battery life management unit 532 may reside on a CD in the CD-ROM drive, on the hard drive, on an ASIC (not shown), etc. In some embodiments, the computer system 500 can include additional devices and/or more than one of each component shown in FIG. 5 (e.g., video cards, audio cards, peripheral devices, etc.). For example, in some instances, the computer system 500 may include multiple processors, multiple cores, multiple external CPU's. In other instances, components may be integrated or subdivided.

While the embodiments are described with reference to various implementations and exploitations, it will be understood that these embodiments are illustrative and that the scope of the inventive subject matter is not limited to them. In general, techniques for battery life management as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. A method comprising:
   determining, by utilizing a portable device, a scheduled event for a user of the portable device;
   estimating, by utilizing the portable device, whether battery power associated with the portable device will last throughout the scheduled event;
   determining, by utilizing the portable device, whether a location of the scheduled event provides one or more battery charging resources if the battery power associated with the portable device is estimated not to last throughout the scheduled event; and
   reserving, by utilizing the portable device, a battery charging resource for the user of the portable device if the location of the scheduled event provides one or more battery charging resources.

2. The method of claim 1, wherein said determining the scheduled event comprises accessing a calendar associated with the user of the portable device to identify the scheduled event and determine information associated with the scheduled event.

3. The method of claim 1, wherein said estimating whether the battery power associated with the portable device will last throughout the scheduled event comprises:
   determining a projected battery power at the start of the scheduled event, a duration of the scheduled event, a role of the user during the scheduled event, and portable device attributes; and
   estimating whether the battery power associated with the portable device will last throughout the scheduled event based, at least in part, on the projected power at the start of the scheduled event, the duration of the scheduled event, the role of the user during the scheduled event, and the portable device attributes.

4. The method of claim 1, wherein said one or more battery charging resources comprises one or more power outlets and/or a wireless charging area.

5. The method of claim 1, wherein said reserving a battery charging resource for the user of the portable device comprises accessing a network-based reservation system to reserve a battery charging resource.

6. The method of claim 1, wherein said accessing the network-based reservation system to reserve a battery charging resource comprises accessing the network-based reservation system to reserve a power outlet and a seat at the location of the scheduled event that is near the power outlet, or to reserve a seat within a wireless charging area at the location of the scheduled event.

7. The method of claim 1, further comprising, if the battery power of the portable device is estimated not to last throughout the scheduled event and the location of the scheduled event does not provide one or more battery charging resources, prompting the user to take a backup battery to the scheduled event.

8. The method of claim 1, further comprising, if the battery power of the portable device is estimated to last throughout the scheduled event, automatically switching the portable device to a preferred power scheme, or prompting the user to select a power scheme out of a plurality of preferred power schemes.

9. The method of claim 1, wherein said reserving a battery charging resource for the user of the portable device comprises:
determining if all the battery charging resources provided at the location of the scheduled event are reserved;
if all the battery charging resources provided at the location of the scheduled event are not reserved, reserving one of the battery charging resources for the user of the portable device; and
if all the battery charging resources provided at the location of the scheduled event are reserved, determining a priority rating for the user of the portable device.

10. The method of claim 9, further comprising:
determining whether the priority rating for the user of the portable device is higher than one or more priority ratings of event participants with reservations for a battery charging resource; and
if the priority rating for the user of the portable device is higher than one or more priority ratings of event participants with reservations for a battery charging resource, causing a reservation of an event participant with a lowest priority rating to be cancelled and reserving a battery charging resource for the user of the portable device.

11. The method of claim 1, if the user of the portable device does not obtain a reservation for a battery charging resource at the location of the scheduled event, further comprising:
detecting when the portable device is running out of power during the scheduled event;
identifying one or more additional portable devices and associated event participants using reserved battery charging resources at the location of the scheduled event; and
determining power status of the one or more additional portable devices and whether the associated event participants are available to share power with the user of the portable device.

12. The method of claim 11, further comprising:
notifying the user of the portable device of the associated event participants that are available to share power; and
in response to a selection by the user of the portable device, sending a request to a selected one of the associated event participants that are available to share power.

13. A computer program product for implementing portable device battery power optimization, the computer program product comprising:
a non-transitory computer readable storage medium having computer readable program code embodied therewith, the computer readable program code configured to,
determine a scheduled event for a user of a portable device;
estimate whether battery power associated with the portable device will last throughout the scheduled event;
determine whether a location of the scheduled event provides one or more battery charging resources if the battery power associated with the portable device is estimated not to last throughout the scheduled event; and
reserve a battery charging resource for the user of the portable device if the location of the scheduled event provides one or more battery charging resources.

14. The computer program product of claim 13, wherein the computer readable program code configured to determine the scheduled event comprises the computer readable program code configured to access a calendar associated with the user of the portable device to identify the scheduled event and determine information associated with the scheduled event.

15. The computer program product of claim 13, wherein the computer readable program code configured to estimate whether the battery power associated with the portable device will last throughout the scheduled event comprises the computer readable program code configured to:
determine a projected battery power at the start of the scheduled event, a duration of the scheduled event, a role of the user during the scheduled event, and portable device attributes; and
estimate whether the battery power associated with the portable device will last throughout the scheduled event based, at least in part, on the projected power at the start of the scheduled event, the duration of the scheduled event, the role of the user during the scheduled event, and the portable device attributes.

16. The computer program product of claim 13, wherein the computer readable program code configured to reserve a battery charging resource for the user of the portable device comprises the computer readable program code configured to access a network-based reservation system to reserve a battery charging resource for the user of the portable device.

17. A computer system comprising:
one or more processors;
a network interface coupled with the one or more processors; and
a battery life management unit operable to,
determine a scheduled event for a user of a portable device;
estimate whether battery power associated with the portable device will last throughout the scheduled event;
determine whether a location of the scheduled event provides one or more battery charging resources if the battery power associated with the portable device is estimated not to last throughout the scheduled event; and
reserve a battery charging resource for the user of the portable device if the location of the scheduled event provides one or more battery charging resources.

18. The computer system of claim 17, wherein the battery life management unit operable to determine the scheduled event comprises the battery life management unit operable to access a calendar associated with the user of the portable device to identify the scheduled event and determine information associated with the scheduled event.

19. The computer system of claim 17, wherein the battery life management unit operable to estimate whether the battery power associated with the portable device will last throughout the scheduled event comprises the battery life management unit operable to:

determine a projected battery power at the start of the scheduled event, a duration of the scheduled event, a role of the user during the scheduled event, and portable device attributes; and estimate whether the battery power associated with the portable device will last throughout the scheduled event based, at least in part, on the projected power at the start of the scheduled event, the duration of the scheduled event, the role of the user during the scheduled event, and the portable device attributes.

20. The computer system of claim 17, wherein the battery life management unit operable to reserve a battery charging resource for the user of the portable device comprises the battery life management unit operable to access a network-based reservation system to reserve a battery charging resource for the user of the portable device.

* * * * *